US006645612B2

(12) United States Patent
Pujari et al.

(10) Patent No.: US 6,645,612 B2
(45) Date of Patent: Nov. 11, 2003

(54) HIGH SOLIDS HBN SLURRY, HBN PASTE, SPHERICAL HBN POWDER, AND METHODS OF MAKING AND USING THEM

(75) Inventors: Vimal K. Pujari, Northboro, MA (US); William T. Collins, Auburn, MA (US); Jeffrey J. Kutsch, Oxford, MA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 0 days.

(21) Appl. No.: 09/923,994

(22) Filed: Aug. 7, 2001

(65) Prior Publication Data
US 2003/0073769 A1 Apr. 17, 2003

(51) Int. Cl.[7] .................... B01F 17/54; B32B 18/00; C04B 35/5833; C08K 3/38; H01L 23/34
(52) U.S. Cl. ................ 428/325; 257/717; 264/13; 423/290; 428/323; 428/402; 501/96.4; 516/33; 516/78; 524/404
(58) Field of Search ............... 516/78, 33; 423/290; 501/96.4; 428/323, 402, 325; 524/404; 264/13; 257/717

(56) References Cited

U.S. PATENT DOCUMENTS

| | | | |
|---|---|---|---|
| 4,107,276 A | 8/1978 | Schwetz et al. | 423/290 |
| 4,188,194 A | 2/1980 | Corrigan | 51/307 |
| 4,195,002 A * | 3/1980 | Radtke et al. | |
| 4,514,370 A | 4/1985 | Inoue et al. | 423/344 |
| 4,634,640 A | 1/1987 | Hunold et al. | 428/704 |
| 4,731,311 A | 3/1988 | Suzuki et al. | 429/213 |
| 4,801,445 A | 1/1989 | Fukui et al. | 424/69 |
| 4,863,881 A | 9/1989 | Ahrens et al. | 501/92 |
| 4,869,954 A | 9/1989 | Squitieri | 428/283 |
| 4,882,225 A | 11/1989 | Fukui et al. | 428/405 |
| 4,997,633 A * | 3/1991 | Koshida et al. | 423/290 |
| 5,001,091 A | 3/1991 | Pujari et al. | 501/103 |
| 5,011,870 A | 4/1991 | Peterson | 523/220 |
| 5,064,589 A * | 11/1991 | Ichikawa et al. | 264/65 |
| 5,098,609 A * | 3/1992 | Iruvanti et al. | 524/404 X |
| 5,116,589 A | 5/1992 | Hoenig | 423/298 |
| 5,194,480 A * | 3/1993 | Block et al. | 524/404 |
| 5,213,868 A | 5/1993 | Liberty et al. | 428/131 |
| 5,229,339 A | 7/1993 | Pujari et al. | 501/96 |
| 5,234,712 A | 8/1993 | Howard | 427/215 |
| 5,283,542 A | 2/1994 | Ochiai et al. | 335/6 |
| 5,285,108 A | 2/1994 | Hastings et al. | 257/712 |
| 5,298,791 A | 3/1994 | Liberty et al. | 257/707 |
| 5,312,571 A | 5/1994 | Pujari et al. | 264/13 |
| 5,374,036 A | 12/1994 | Rogers et al. | 266/45 |
| 5,466,269 A | 11/1995 | Corrigan et al. | 51/307 |
| 5,466,400 A | 11/1995 | Pujari et al. | 264/13 |
| 5,508,110 A | 4/1996 | Howard | 428/402 |
| 5,510,174 A | 4/1996 | Litman | 428/261 |
| 5,525,557 A | 6/1996 | Pujari et al. | 501/97 |
| 5,528,462 A | 6/1996 | Pendse | 361/767 |
| 5,545,473 A | 8/1996 | Ameen et al. | 428/283 |
| 5,567,353 A * | 10/1996 | Bogan, Jr. | 501/96 X |
| 5,571,760 A | 11/1996 | Pujari et al. | 501/97 |
| 5,591,034 A | 1/1997 | Ameen et al. | 439/91 |
| 5,593,773 A | 1/1997 | McKay et al. | 428/328 |
| 5,601,874 A | 2/1997 | Howard et al. | 427/215 |
| 5,660,917 A | 8/1997 | Fujimori et al. | 428/195 |
| 5,681,883 A * | 10/1997 | Hill et al. | 524/404 |
| 5,688,457 A | 11/1997 | Buckmaster et al. | 264/211 |
| 5,696,041 A | 12/1997 | Collins et al. | 501/97 |
| 5,738,936 A | 4/1998 | Hanrahan | 428/313.5 |
| 5,759,481 A | 6/1998 | Pujari et al. | 264/655 |
| 5,781,412 A * | 7/1998 | de Sorgo | 257/717 X |
| 5,849,316 A | 12/1998 | Mellul et al. | 424/401 |
| 5,854,155 A * | 12/1998 | Kawasaki et al. | 501/96.4 |
| 5,898,009 A | 4/1999 | Shaffer et al. | 501/96.4 |
| 5,907,474 A | 5/1999 | Dolbear | 361/705 |
| 5,908,796 A | 6/1999 | Pujari et al. | 501/97.1 |
| 5,926,371 A | 7/1999 | Dolbear | 361/704 |
| 5,950,066 A | 9/1999 | Hanson et al. | 428/551 |
| 5,981,641 A | 11/1999 | Takahashi et al. | 524/428 |
| 5,985,228 A | 11/1999 | Corrigan et al. | 423/290 |
| 6,048,511 A | 4/2000 | Shaffer et al. | 423/290 |
| 6,110,527 A | 8/2000 | Brun et al. | 427/214 |
| 6,158,894 A | 12/2000 | Pujari et al. | 384/492 |

(List continued on next page.)

FOREIGN PATENT DOCUMENTS

| | | |
|---|---|---|
| EP | 0 279 769 A2 | 8/1988 |
| EP | 0 939 066 A1 | 9/1999 |
| GB | 2 301 818 A | 12/1996 |
| JP | 11-134944 A | 5/1999 |

OTHER PUBLICATIONS

Carborundum Boron Nitride Data Sheet, "Cosmetic Grade Boron Nitride Powders" (6/98).

"Silicones & Silicon–Containing Polymers," *Petrarch Systems Silanes and Silicones: Silicon Compounds Register & Review* (1987).

Hagio et al., "Sintering of the Mechanochemically Activated Powders of Hexagonal Boron Nitride," *J. Am. Ceram. Soc.*, 72(8):1482–84 (1989).

*Primary Examiner*—Richard D. Lovering
(74) *Attorney, Agent, or Firm*—Nixon Peabody LLP

(57) ABSTRACT

The present invention relates to a method for making a hexagonal boron nitride slurry and the resulting slurry. The method involves mixing from about 0.5 wt. % to about 5 wt. % surfactant with about 30 wt. % to about 50 wt. % hexagonal boron nitride powder in a medium under conditions effective to produce a hexagonal boron nitride slurry. The present invention also relates to a method for making a spherical boron nitride powder and a method for making a hexagonal boron nitride paste using a hexagonal boron nitride slurry. Another aspect of the present invention relates to a hexagonal boron nitride paste including from about 60 wt. % to about 80 wt. % solid hexagonal boron nitride. Yet another aspect of the present invention relates to a spherical boron nitride powder, a polymer blend including a polymer and the spherical hexagonal boron nitride powder, and a system including such a polymer blend.

36 Claims, 2 Drawing Sheets

U.S. PATENT DOCUMENTS 6,162,849 A * 12/2000 Zhuo et al. .................. 524/404
6,168,859 B1    1/2001 Mills et al. .................. 428/329
6,255,376 B1 *  7/2001 Shikata et al. .............. 524/404
6,284,817 B1    9/2001 Cross et al. ................. 523/220
6,319,602 B1 * 11/2001 Fauzi et al. ............. 423/290 X
6,548,152 B2 *  4/2003 Nakatani et al. ........ 428/325 X

* cited by examiner

HIGH SOLIDS HBN SLURRY, HBN PASTE, SPHERICAL HBN POWDER, AND METHODS OF MAKING AND USING THEM

FIELD OF THE INVENTION

The present invention relates to a method for making a hexagonal boron nitride slurry, a method for making a hexagonal boron nitride paste, and a method for making a spherical hexagonal boron nitride powder. The present invention also relates to the resulting hexagonal boron nitride slurry, paste, and spherical hexagonal boron nitride powder, and the use of the spherical hexagonal boron nitride powder in a polymer blend and system including a heat source and a heat sink.

BACKGROUND OF THE INVENTION

Microelectronic devices, such as integrated circuit chips, are becoming smaller and more powerful. The current trend is to produce integrated chips which are steadily increasing in density and perform many more functions in a given period of time over predecessor chips. This results in an increase in the electrical current used by these integrated circuit chips. As a result, these integrated circuit chips generate more ohmic heat than the predecessor chips. Accordingly, heat management has become a primary concern in the development of electronic devices.

Typically, heat generating sources or devices, such as integrated circuit chips, are mated with heat sinks to remove heat which is generated during their operation. However, thermal contact resistance between the source or device and the heat sink limits the effective heat removing capability of the heat sink. During assembly, it is common to apply a layer of thermally conductive grease, typically a silicone grease, or a layer of a thermally conductive organic wax to aid in creating a low thermal resistance path between the opposed mating surfaces of the heat source and the heat sink. Other thermally conductive materials are based upon the use of a binder, preferably a resin binder, such as a silicone, a thermoplastic rubber, a urethane, an acrylic, or an epoxy, into which one or more thermally conductive fillers are distributed.

Typically, these fillers are one of two major types: thermally conductive, electrically insulative or thermally conductive, electrically conductive fillers. Aluminum oxide, magnesium oxide, zinc oxide, aluminum nitride, and boron nitride are the most often cited types of thermally conductive, electrically insulative fillers used in thermal products. Boron nitride, and, more specifically, hexagonal boron nitride (hBN) is especially useful in that it has excellent heat transfer characteristics and is relatively inexpensive.

For fillers, it is desirable to achieve as high a thermal conductivity (or as low a thermal resistant) as possible. In order to achieve sufficient thermal conductivity with presently used fillers, such as hBN, it is desirable to employ high loadings of filler in the binder. However, because of the flaky (platelet) structure of hBN particles, achieving solids loading higher than 20 vol. % becomes difficult.

U.S. Pat. Nos. 5,898,009, 6,048,511, and European Patent No. EP 0 939 066 A1, all to Shaffer et al., teach an alternate methodology to further improve solids hBN loading. This involves: (a) cold pressing crushed hBN powder, (b) breaking the cold pressed compact into smaller pieces, and (c) screening the resulting pieces to achieve agglomerates in a desired size range. These agglomerates, however, are non-spherical (angular shape) with jagged short edges. This shape is not ideal for optimizing solids loading due, primarily, to the following reasons: (1) non-spherical shaped agglomerates do not slide against each other easily, thus raising the viscosity; and (2) non-spherical shaped agglomerates have higher surface area and hence absorb greater amounts of polymer on their surface which results in lower amounts of free available polymer, thus, once again raising the viscosity.

Thus, there is a need for thermally conductive filler materials which can be used at high loading levels to achieve sufficient thermal conductivity without increasing viscosity. The present invention is directed to overcoming this deficiency in the art.

SUMMARY OF THE INVENTION

The present invention relates to a method for making a hexagonal boron nitride slurry. The method involves mixing from about 0.5 wt. % to about 5 wt. % surfactant with about 30 wt. % to about 50 wt. % hexagonal boron nitride powder in a medium under conditions effective to produce a hexagonal boron nitride slurry.

The present invention also relates to a hexagonal boron nitride slurry including from about 0.5 wt. % to about 5 wt. % surfactant and about 30 wt. % to about 50 wt. % hexagonal boron nitride powder in a medium.

Another aspect of the present invention is a method for making spherical boron nitride powder which includes providing a hexagonal boron nitride slurry, spray drying the slurry under conditions effective to produce spherical boron nitride powder, including spherical agglomerates of boron nitride platelets, and sintering the spherical boron nitride powder.

Yet another aspect of the present invention relates to a spherical boron nitride powder including spherical agglomerates of boron nitride platelets.

The present invention also relates to a method for making a hexagonal boron nitride paste. This method involves providing a hexagonal boron nitride slurry and treating the slurry under conditions effective to produce a hexagonal boron nitride paste including from about 60 wt. % to about 80 wt. % solid hexagonal boron nitride.

Another aspect of the present invention relates to a hexagonal boron nitride paste including from about 60 wt. % to about 80 wt. % solid hexagonal boron nitride in a medium.

The present invention further relates to a polymer blend including a polymer and a powder phase including spherical agglomerates of hexagonal boron nitride platelets. The powder phase is distributed homogeneously within the polymer.

Another aspect of the present invention relates to a system including a heat source, a heat sink, and a thermally conductive material connecting the heat source to the heat sink, wherein the thermally conductive material includes a powder phase including spherical agglomerates of hexagonal boron nitride platelets.

The hexagonal boron nitride slurry of the present invention allows high solids loading while keeping low viscosity. In addition, the slurry can be used to produce high yields of hexagonal boron nitride powder and paste. The spherical shape of the hBN agglomerates of the present invention reduces inter-agglomerate friction, thus allowing higher solids loading in a polymer and, accordingly, higher thermal conductivity. In addition, spherical shaped hBN agglomerates have the lowest surface area possible, which reduces the amount of adsorbed polymer on the agglomerate surfaces, thus freeing up more polymer to improve flowability/reduce viscosity. Moreover, in the spherical hBN powder of the present invention, the distribution of hBN platelets in the spherical agglomerates is random (as compared to aligned flakes in pressed agglomerates of the prior art). Thus, spherical hBN filled polymer in accordance with the present invention should show more isotropic thermal conductivity and higher thermal conductivity through the thickness of the polymer.

DETAILED DESCRIPTION OF THE INVENTION

The present invention relates to a method for making a hexagonal boron nitride slurry. The method involves mixing from about 0.5 wt. % to about 5 wt. % surfactant with about 30 wt. % to about 50 wt. % hexagonal boron nitride powder in a medium under conditions effective to produce a hexagonal boron nitride slurry.

As used herein, a slurry is a thin mixture or suspension of a liquid (i.e., aqueous or non-aqueous medium) and insoluble matter.

Figure 1:
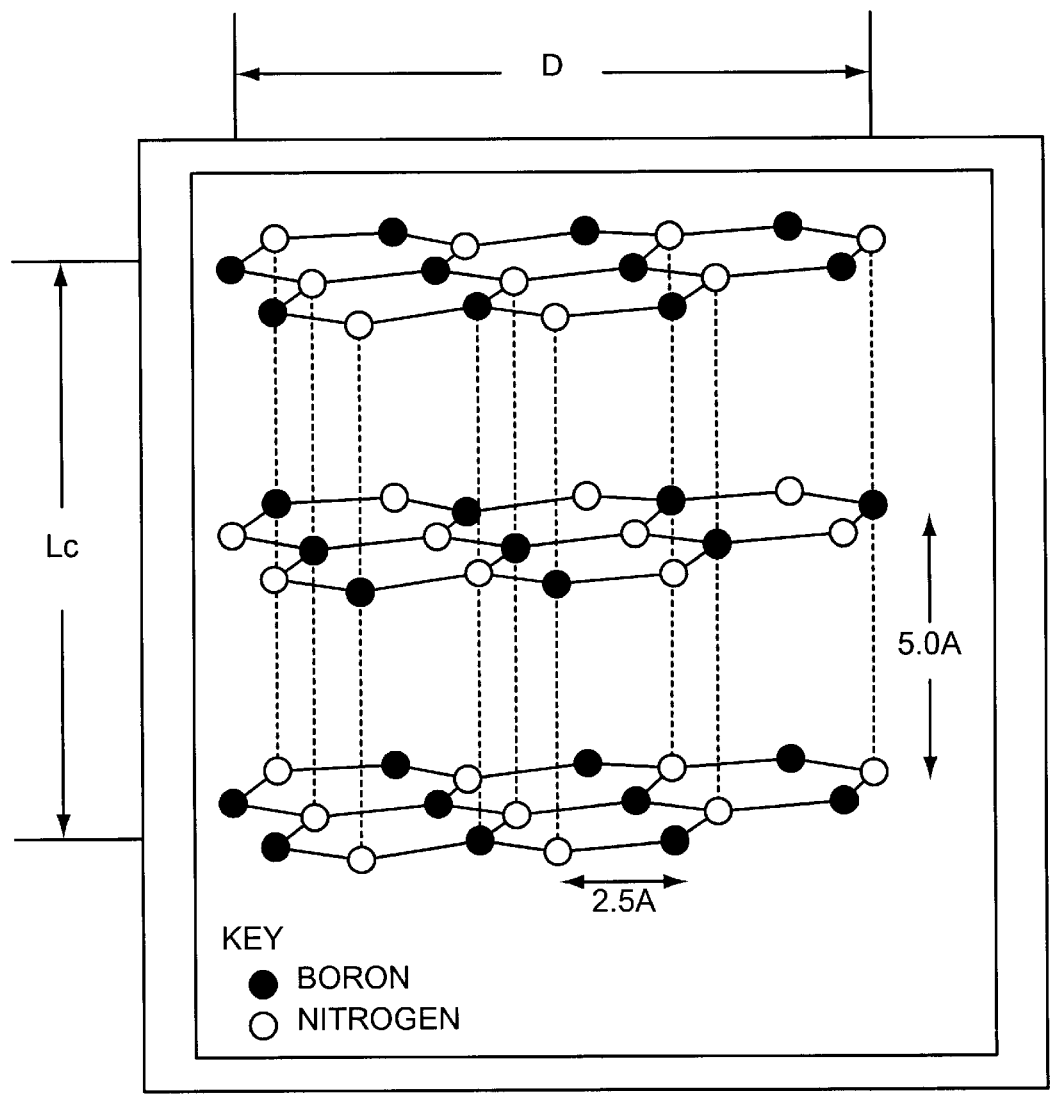
FIG. 1 is a graphic showing the structure of boron nitride, where many of these units make up a BN platelet.

Hexagonal boron nitride is an inert, lubricious ceramic material having a platey hexagonal crystalline structure (similar to that of graphite) ("hBN"). The well-known anisotropic nature of hBN can be easily explained by referring to FIG. 1, which shows hexagons of an hBN particle. The diameter of the hBN particle platelet is the dimension shown as D in FIG. 1, and is referred to as the a-direction. BN is covalently bonded in the plane of the a-direction. The particle thickness is the dimension shown as Lc, which is perpendicular to diameter and is referred to as the c-direction. Stacked BN hexagons (i.e., in the c-direction) are held together only by Van der Waals forces, which are relatively weak. When a shearing force greater than the weak Van der Waals force is imparted across of the planes of BN hexagons, the weak Van der Waals force is overcome and the planes slide relative to each other. The relative ease with which these planes of BN slide against each other may be one of the reasons for the high lubricity of hBN.

Preferably, the hBN is a powder having a highly ordered hexagonal structure. Such powders have a crystallization index (Hubacek, "Hypothetical Model of Turbostratic Layered Boron Nitride," *J. Cer. Soc. of Japan*, 104:695–98 (1996), which is hereby incorporated by reference in its entirety) of at least 0.12 (quantification of highly hexagonal hBN) and, preferably, greater than 0.15. Preferably, the hBN powder has a crystallinity of about 0.20 to about 0.55, most preferably, from about 0.30 to about 0.55.

Typically, this starting powder is produced by a "high fire" treatment of a raw, essentially turbostratic (amorphous) boron nitride powder (see Hagio et al., "Microstructural Development with Crystallization of Hexagonal Boron Nitride," *J. Mat. Sci. Lett.* 16:795–798 (1997), which is hereby incorporated by reference in its entirety) to produce what is conventionally referred to as "high purity hexagonal boron nitride." In a preferred embodiment, a fine turbostratic BN powder having a crystallization index of less than 0.12 is heat treated in nitrogen at about 1400 to 2300° C. for about 0.5–12 hours. This heat treatment typically acts to produce a more crystalline hBN platelets, as the fine, <1 µm crystallites, of turbostratic powder platelets become more ordered (crystallized) and larger (>1 micron) during the heat treatment.

Preferably, the particles of the hBN starting material have an average particle-platelet size of from about 2 µm to about 20 µm, more preferably between about 2 µm and 12 µm, and most preferably, between about 4 µm and about 12 µm. As used herein, "particle size" or "diameter" of the hBN particle platelet is the dimension shown as D in FIG. 1. This is typically measured by scanning electron microscopy and laser scattering techniques using, e.g., a Leeds & Northrup Microtrac X100 (Clearwater, Fla.).

In another embodiment, the hBN starting material has an oxygen content of from about 0 wt. % to about 1.0 wt. %, preferably, from about 0 wt. % to about 0.5 wt. %. The use of hBN starting material with a low oxygen content produces boron nitride powders with a higher tap density. Higher tap density powders have many advantages as fillers in thermal management applications including: higher thermal conductivity, higher powder loading in a polymer; stronger agglomerates of hBN platelets (leading to improved metal adhesion in polymer BN composites); and lower porosity within the agglomerates (which results in less infiltration of polymer resin or liquid into the agglomerate).

Preferably, the hBN slurry of the present invention includes from about 40 wt. % to about 50 wt. % hexagonal boron nitride powder.

In yet another embodiment, the hBN starting material has a surface area of from about 5 $m^2/g$ to about 30 $m^2/g$, and more preferably, about 7 $m^2/g$ to about 20 $m^2/g$.

The hBN slurry of the present invention may include an aqueous or non-aqueous medium. Suitable non-aqueous medium include isopropyl alcohol, methanol, and ethanol.

The hexagonal boron nitride slurry of the present invention is a "high solids" hBN slurry which, in one embodiment, includes from about 30 wt. % to about 50 wt. % hexagonal boron nitride solids loading. In another embodiment, the high solids hexagonal boron nitride slurry of the present invention includes from about 40 wt. % to about 50 wt. % hexagonal boron nitride solids loading.

Suitable surfactants for the above method of the present invention include polycarboxylic acids (e.g., Rhodaline 111M™ available from Rhodia, Inc., Cranbury, N.J.), silanes (e.g., Z-6040 Silane™ available from Dow Chemical, Midland Mich.), and organometallic compounds (e.g., APG™ available from Cavedon Chemical Co., Woonsocket, R.I.).

The hBN slurry of the present invention may include additives, such as binders and sintering additives. Suitable binders include polyethylene glycol, polyvinyl alcohol, glycerol, and latex. When the hBN slurry of the present invention is used to produce hBN powder, the slurry may contain sintering additives which include, but are not limited to, yttria, CaO, MgO, $CeB_6$, and boron.

The present invention also relates to a hexagonal boron nitride slurry including from about 0.5 wt. % to about 5 wt. % surfactant and about 30 wt. % to about 50 wt. % hexagonal boron nitride powder in a medium.

The hBN slurry of the present invention achieves high solids loading while keeping low viscosity. In particular, solids loading of from about 30 wt. % to about 50 wt. % is achieved in the high solids hBN slurry of the present invention. Although not wishing to be bound by theory, it is believed that because of the flaky, non-wettable nature of hBN, the use of from about 0.5 wt. % to about 5 wt. % surfactant in the slurry of the present invention allows such high solids loading. This is in contrast to prior art methods which used about 0.1 wt. % to about 0.5 wt. % surfactant to achieve a BN solids loading of from about 20 wt. % to about 25 wt. %.

The high solids hBN slurry of the present invention may be used to produce high yields of hexagonal boron nitride powder and paste, as described in detail below.

Another aspect of the present invention relates to a method for making spherical boron nitride powder which includes providing a hexagonal boron nitride slurry, spray drying the slurry under conditions effective to produce spherical boron nitride powder including spherical agglomerates of boron nitride platelets, and sintering the spherical boron nitride powder.

As used herein, an agglomerate is a collection of boron nitride platelets bonded together. A non-agglomerated boron nitride platelet comprises one or more crystallites.

In one embodiment, the spherical agglomerates of boron nitride platelets have an average agglomerate size or diameter of from about 10 microns to about 500 microns.

In another embodiment, the majority of boron nitride agglomerates have an average diameter of from about 30 microns to about 150 microns.

The hexagonal boron nitride slurry is preferably a high solids hexagonal boron nitride slurry in accordance with the present invention.

Techniques for spray drying are known in the art and are described in, for example, James S. Reed, Introduction to the Principles of Ceramic Processing, John Wiley & Sons, Inc. (1988), which is hereby incorporated by reference in its entirety.

Preferably, the sintering is carried out at a temperature of at least about 1800° C. for about 1 to about 4 hours, more preferably, for about 2 to about 3 hours. Further, the sintering is preferably carried out at from about 1800° C. to about 2400° C., more preferably, from about 2000° C. to about 2400° C., most preferably, from about 2000° C. to about 2100° C. Suitable atmospheres for sintering include inert gas, nitrogen, and argon. In one embodiment, the sintering is carried out in a vacuum. In an another embodiment, the sintering is carried out under conditions of at least 1 atmosphere of pressure.

The resulting powder tap density preferably ranges from about 0.4 g/cc to about 0.7 g/cc.

In accordance with the present invention, the sintering step improves the thermal diffusivity and, thus, thermal conductivity of the resulting boron nitride powder and hardens and strengthens the boron nitride powder. Although not wishing to be bound by theory, it is believed that during sintering, individual grains of boron nitride grow into each other to form an interconnected network. The interconnectivity of the resulting sintered body results in increased thermal diffusivity and increased thermal conductivity.

In one embodiment, the spherical boron nitride powder is classified under conditions effective to obtain a desired agglomerate size distribution. As used herein, an agglomerate size distribution is the range of agglomerates from the smallest agglomerate present to the largest agglomerate present, as defined by characteristic diameter of the agglomerates, wherein the agglomerates span the range. Suitable methods for classification include screening, air classifying, and elutriation, (see Chem. Eng. Handbook, Perry & Chilton, 5$^{th}$ Ed., McGraw-Hill (1973), which is hereby incorporated by reference in its entirety). As such classification methods are well known in the art, they will only be discussed briefly herein.

Screening is the separation of a mixture of various sized solid particles/agglomerates into two or more portions by means of a screening surface. The screening surface has openings through which the smaller particles/agglomerates will flow, while the larger particles/agglomerates remain on top. This process can be repeated for both the coarse and small particle/agglomerate size streams, as many times as necessary, through varying screen openings to obtain a classification of particles/agglomerates into a desired particle/agglomerate size range.

Air classifiers rely upon air drag and particle inertia, which depends upon particle/agglomerate size, to facilitate the separation of fine particles/agglomerates from coarse particles/agglomerates.

One design for elutriation is a vertical gravity type elutriator, where fluid flowing up through a column carries fine particles/agglomerates smaller than a critical size. The critical size is determined by the settling velocity of the particle/agglomerate in the fluid.

A desired agglomerate range or agglomerate size distribution (ASD) is determined by the intended use of the spherical boron nitride powder. For example, for compliant interface pads, where the polymer is a low durometer silicone rubber, the desired ASD is such that the coarsest agglomerate diameter is smaller than the thickness of the interface pad. For situations in which flexibility of a polymer including the spherical boron nitride is important, large agglomerates, e.g., above 150 microns, are reduced in concentration or removed entirely, as the use of smaller agglomerates improves flexibility of the resulting polymer blend. In addition, a plurality of agglomerate size ranges may be combined in the spherical boron nitride powder to achieve the desired flexibility and thermal conductivity, as smaller agglomerates will fit within the interstitial spaces of the larger agglomerates.

Preferably, the ASD is 30 to 125 microns (more preferably 74 to 125 microns, most preferably 74 to 105 microns), or 20 to 74 microns (more preferably 38 to 74 microns, most preferably 38 to 53 microns), or 10 to 38 microns (more preferably 20 to 38 microns).

The present invention also relates to a spherical boron nitride powder including spherical agglomerates of boron nitride platelets.

The spherical boron nitride powder of the present invention can be used as a filler for thermal management applications, e.g., in composites, polymers, and fluids, as described below. The spherical boron nitride powder can also be used in hot pressing, due to the improved packing density and uniform fill characteristics of the powder. Moreover, the resulting spherical boron nitride powder can be used as precursor feed stock material in the conversion of hexagonal boron nitride to cubic boron nitride. In the conversion of high purity hexagonal boron nitride to cubic boron nitride, the compacted form of boron nitride is subjected to extremely high pressures and temperatures within the stable region of the cubic boron nitride phase diagram. The density of the boron nitride pellets is significant to the economics of the cubic boron nitride conversion process.

Another aspect of the present invention is a method for making a hexagonal boron nitride paste. This method involves providing a hexagonal boron nitride slurry and treating the slurry under conditions effective to produce a hexagonal boron nitride paste including from about 60 wt. % to about 80 wt. % solid hexagonal boron nitride.

As used herein, as paste is a semisolid preparation.

The hexagonal boron nitride slurry is preferably a high solids hexagonal boron nitride slurry in accordance with the present invention.

In one embodiment, treating comprises placing the slurry in a plaster slip cast mold. The plaster mold will absorb water from the slurry to produce a hexagonal boron nitride paste according to the present invention. Knowing the porosity of the mold, e.g., from about 1 to about 5 $\mu$m, the solids content of the hexagonal boron nitride paste can be controlled by the casting time.

In another embodiment, treating comprises vacuum filtration of the slurry until the desired amount of liquid is removed from the slurry to produce a hexagonal boron nitride paste according to the present invention.

Yet another aspect of the present invention relates to a hexagonal boron nitride paste including from about 60 wt. % to about 80 wt. % solid hexagonal boron nitride in a medium.

The hBN paste of the present invention may include an aqueous or non-aqueous medium. Suitable non-aqueous medium include isopropyl alcohol, methanol, and ethanol.

Preferably, the hexagonal boron nitride paste includes from about 65 wt. % to about 75 wt. % solid hexagonal boron nitride.

The hexagonal boron nitride paste of the present invention can be used to form solids of varying shapes, e.g., by an extrusion process. Such solids can then be used, for example, as a filler in thermal management applications.

The present invention further relates to a polymer blend including a polymer and a powder phase including spherical agglomerates of hexagonal boron nitride platelets. The powder phase is distributed homogeneously within the polymer.

Suitable polymer systems may include melt-processable polymers, polyesters, phenolics, silicone polymers (e.g., silicone rubbers), acrylics, waxes, thermoplastic polymers, low molecular weight fluids, and epoxy molding compounds.

In one embodiment, the polymer blend comprises from about 30 wt. % to about 80 wt. % spherical boron nitride powder. However, the loading of the spherical boron nitride powder into the polymer blend is determined by the desired flexibility and thermal conductivity of the resulting blend. For example, lower loading of the spherical hBN powder, such as 30 wt. % to 50 wt. %, is desirable for high flexibility applications, but results in lower thermal conductivity. Thus, loading at from about 50 wt. % to about 80 wt. % is desirable in high thermal conductivity/low flexibility applications.

The thermal conductivity of the resulting polymer blend is determined by loading, dispersion, and other factors. In one embodiment, the polymer blend has a thermal conductivity of from about 1 W/mK to about 15 W/mK.

Because of the spherical shape of the hBN agglomerates in the polymer blends of the present invention, inter-agglomerate friction is reduced, thus allowing higher solids loading and, accordingly, higher thermal conductivity.

In addition, spherical shaped hBN agglomerates have the lowest surface area possible, which reduces the amount of adsorbed polymer on the agglomerate surfaces, thus freeing up more polymer to improve flowability/reduce viscosity.

Typically, hBN powder for loading into polymers has been produced by a pressing process (see, e.g., U.S. Pat. Nos. 5,898,009, 6,048,511, and European Patent No. EP 0 939 066 A1 all to Shaffer et al., which are hereby incorporated by reference in their entirety), which produces hBN powder including non-spherical agglomerates of aligned hBN platelets. However, in the spherical hBN powder of the present invention, the distribution of hBN platelets is random (as compared to aligned flakes in pressed agglomerates). Thus, spherical hBN filled polymer film in accordance with the present invention should show more isotropic thermal conductivity and higher thermal conductivity through the thickness of the polymer.

Another aspect of the present invention relates to a system including a heat source, a heat sink, and a thermally conductive material connecting the heat source to the heat sink, wherein the thermally conductive material includes a powder phase including spherical agglomerates of hexagonal boron nitride platelets.

As used herein, a heat sink is a body of matter, gaseous, liquid, or solid, that receives a heat transfer from its surrounding environment.

Suitable heat sources for the present invention include integrated circuit chips, power modules, transformers, and other electronic devices.

Suitable heat sinks in accordance with the present invention include finned aluminum, copper, berilium, and diamond.

As used herein, a thermally conductive material may be a composite, polymer, or fluid. In one embodiment, the thermally conductive material is a polymer, such as a melt-processable polymer, a polyester, a phenolic, a silicone polymer (e.g., silicone rubbers), an acrylic, a wax, a thermoplastic polymer, a low molecular weight fluid, or an epoxy molding compound.

The thermally conductive material preferably includes from about 30 wt. % to about 80 wt. % spherical boron nitride powder and has a thermal conductivity of from about 1 W/mK to about 15 W/mK.

EXAMPLES

Example 1

Production of High BN Solids Loaded Slurry

A 50 wt. % solid loaded BN slurry was made using the mix composition as set forth in Table 1:

TABLE 1

Mix composition for 50 wt. % solid loaded BN slurry.

| Solids-50 wt. % | | Liquids-50 wt. % | |
|---|---|---|---|
| XP1011 BN[1] | 1400 g | 85% DI water (pH 9) | 1700 g |
| HPP 325 BN[2] | 500 g | 10% IPA[4] | 200 g |
| $Y_2O_3$[3] | 100 g | 5% 111 M[5] (surfactant) | 100 g |
| | | Opt. 4% glycerol | |

[1]Saint-Gobain Ceramics & Plastics, Amherst, NY
[2]Saint-Gobain Ceramics & Plastics, Amherst, NY
[3]Molycorp, Inc., Mountain Pass, CA
[4]Alfa Aesar, Ward Hill, MA
[5]Rhodaline 111 M, Rhodia, Inc., Cranbury, NJ The correct amounts of powders and liquids set forth in Table 1 were measured out. The deionized (DI) water was then pH adjusted to 9–9.5. Surfactant was added to isopropyl alcohol (IPA) in a large "final mix" sized bucket (Nalgene Nunc, Rochester, N.Y.), approximately 10 L. The surfactant/IPA solution was agitated using air powered propeller mixer (Lightnin, Rochester, N.Y.). Powder was slowly added to the surfactant/IPA solution until the solution could no longer accept more powder. This was done to "coat" the majority of the BN powder with a thin layer of IPA, which wets the BN surface easier than DI water. pH balanced DI water was added as needed maintain a mixable viscosity of slurry. Hand mixing with a spatula may be required to incorporate powder from container wall.

To ensure good mixing, the slurry was pumped through a high shear mill (Netzsch Mill, Netzsch, Inc., Exton, Pa.). Mill times determined "mixedness" and surface area. An auxiliary cooling unit (Chiller, Neslab Instruments, Portsmouth, N.H.) needed to be attached to mill to keep slurry temperature low enough to decrease the evaporation rate of IPA.

After all BN powder was added, the pH of the slurry was measured to be 8.5 and adjusted to 9 by the addition of NaOH. The slurry at this stage appeared quite viscous but exhibited good shear thinning.

Figure 2:
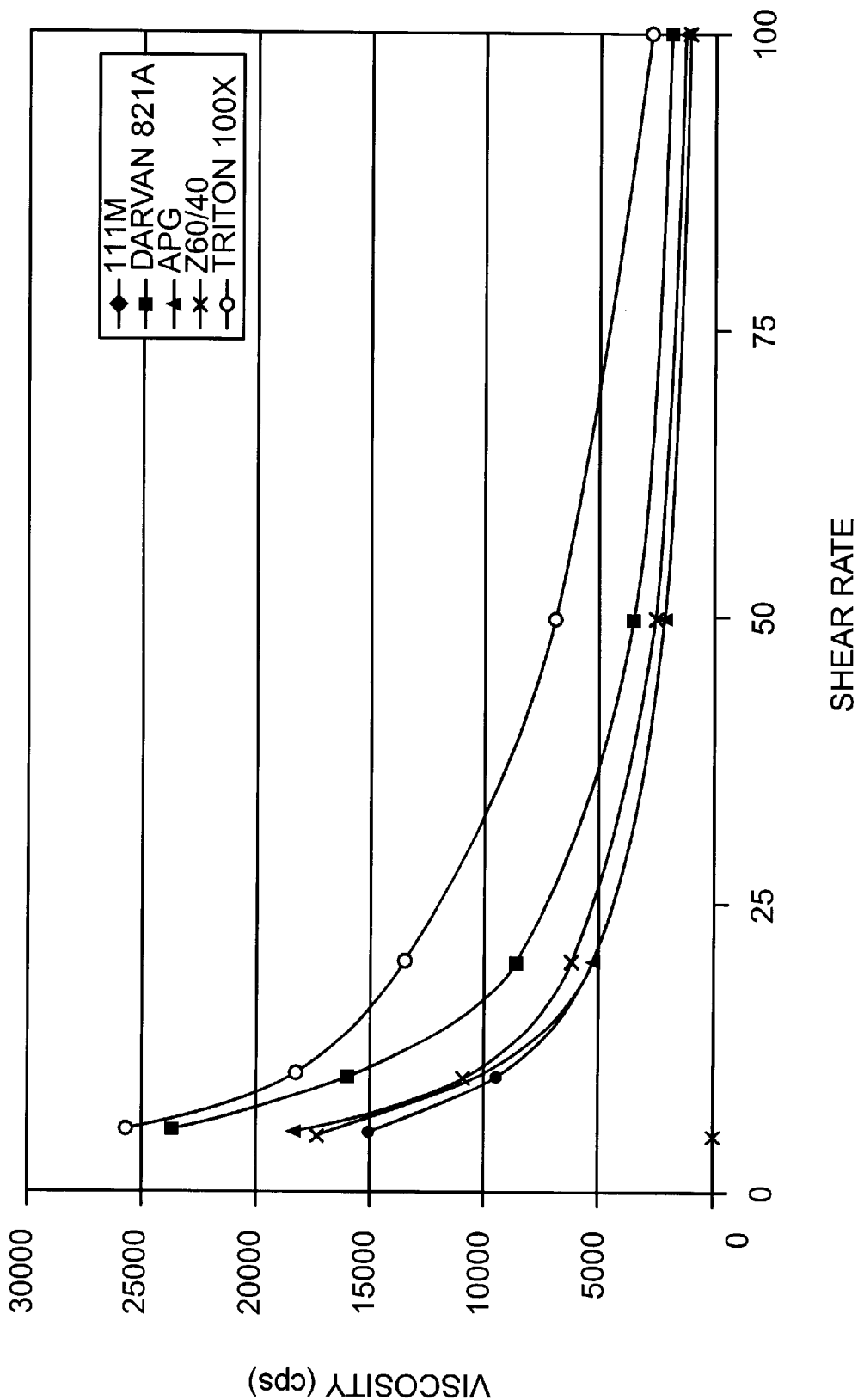
FIG. 2 is a graph showing the rheological properties of a 50% solids BN slurry with various surfactants.

The effect of slurry viscosity versus shear rate for several different surfactants was measured. The surfactant content, as shown in Table 1, was 5 wt. % of the of the total solids content. The results are shown in FIG. 2, where Rhodaline 111M™ (Rhodia, Inc., Cranbury, N.J.) proved most effective at reducing viscosity.

Subsequently, the slurry was transferred to a sealed container for use as needed.

Example 2

Mixing of Sintering Additives

The addition of sintering additives to BN powder was ideally done in a slurry form. This helped create a homogeneous blend of BN and sinter aid. If slurry blending was not possible or practical, a dry mixing method was used.

The technique used to make dry mixes depended on the amount of sample required. If the sample size was approximately less than 25 g, a mortar and pestle was used to mix the powders. The powder was mixed like this for 10 minutes then used as needed.

If larger amounts of powder were needed, a paint shaker was used to blend the powders. When using the paint shaker, ⅜" $Si_3N_4$ media was used in a Nalgene Nunc container (Rochester, N.Y.) to assist in blending powders. The amount of media used was approximately ¼ the height of the powder column in the Nalgene container. An appropriately sized container was used for each size batch. The paint shaker was set to run for 25 minutes and mixing began. After mixing, $Si_3N_4$ media was screened out and the powder was collected and pressed. If pressing was difficult, a few weight percent of low molecular weight polyethylene glycol was added in the mixing stage as a binder.

Example 3

Spray Drying of BN Slurry

The BN slurry of Example 1 was spray dried in order to produce a BN powder for die-fill applications. Spray drying also afforded the quickest way to produce a homogeneous, multi-component, pressureless sinter powder system. Although a 50 wt. % solids BN slurry seemed very highly loaded compared to other ceramic systems, it contained significant amounts of water. In order to evaporate all this water in the available residence time, and inlet and outlet temperatures had to be increased. Along with these changes, the flow rate of the slurry was slowed down and the revolutions per minute (rpm) of the atomizer increased. In addition, 4 wt. % glycerol was added into the slurry before spray drying if it was going to be used for dry pressing applications. During spray drying, the slurry was constantly mixed.

The inlet temperature was set to 235° C. which gave an outlet temperature of 85° C. The flow rate of the slurry was 60 ml/minute and the atomizer (Pentronix, Detroit, Mich.) was set at 12,500 rpm. These settings generally produced spherical BN powder in the size range of $-150\ \mu m/+30\ \mu m$. The lower end of the scale was quite variable depending on the dust collector damper setting. The powder collected had a moisture content of approximately 0.25–0.5%.

The slurry example outlined above required about 70 minutes to put through the spray dryer under these conditions. The powder yield was about 80% after screening out coarse particles, accounting for wall material, and material collected in the cyclone.

All of the conditions above are only valid for the spray dryer used in the present Example. Minor changes would be needed for work in any other system, which is expected. Larger dryers would allow more flexibility in particle size distribution and higher production rates.

The effect of wt. % boron nitride solids slurry loading on spray dried properties was then tested, as shown in Table 2.

TABLE 2

Effect of wt. % BN solids slurry loading on spray dried properties.

| Powder | Solids (wt. %) | LPD (g/cc) | Tap Density (g/cc) | Flow (sec) | Sizing (mm) |
|---|---|---|---|---|---|
| A | 25 | 0.462 | 0.55 | 55.7 | −150/+75 |
| B | 25 | 0.492 | 0.586 | 57.4 | −75 |
| C | 25 | n/a | 0.541 | | −45 |
| D | 50 | 0.533 | 0.62 | 54 | −75 |
| E | 50 | 0.574 | 0.652 | 43.2 | −150 |
| XP | n/a | 0.44 | 0.562 | 75.3 | −105/+74 |

Powders B and D, which were screened to the same size, showed that as solids loading increased, the density of the resulting spray dried powder increased.

Example 4

Production of BN Clay-Like Paste by the Slip Cast Method

Slurry from Example 1 was poured into a plaster slip cast mold. Pressure was applied and the set-up left to cast on the order of 12 hours. Because the molds were "blinded" so quickly, casting stopped and no more moisture was removed from the slip. The resultant material was a thick pasty material. The solids content was 76%.

Example 5

Production of BN Clay-Like Paste by the Vacuum Filtration Method

Slurry from Example 1 was poured into a Buchner Funnel with filter paper. A vacuum was pulled on the slurry from below. The water from the system flowed into a graduated flask. When the desired amount of water was removed from the slurry, the vacuum was removed. The BN paste sample, which had a solids content of 74%, was collected and sealed in an airtight bag for later use.

Although preferred embodiments have been depicted and described herein, it will be apparent to those skilled in the relevant art that various modifications, additions, substitutions and the like can be made without departing from the spirit of the invention and these are therefore considered to be within the scope of the invention as defined in the following claims.

What is claimed:

1. A method for making spherical boron nitride powder comprising:
   providing a hexagonal boron nitride slurry;
   spray drying the slurry under conditions effective to produce spherical boron nitride powder comprising spherical agglomerates of boron nitride platelets; and
   sintering the spherical boron nitride powder.

2. The method according to claim 1, wherein the hexagonal boron nitride slurry comprises from about 30 wt. % to about 50 wt. % hexagonal boron nitride powder.

3. The method according to claim 1, wherein the spherical boron nitride powder has a tap density of about 0.4 g/cc to about 0.7 g/cc.

4. The method according to claim 1, wherein the sintering is carried out at a temperature of from about 1800° C. to about 2400° C.

5. The method according to claim 1, wherein the spherical agglomerates of boron nitride platelets have an average agglomerate diameter of from about 10 microns to about 500 microns.

6. The method according to claim 5, wherein the majority of boron nitride agglomerates have an average diameter of from about 30 microns to about 150 microns.

7. The method according to claim 1 further comprising;
   classifying the spherical boron nitride powder under conditions effective to obtain a desired agglomerate size distribution.

8. The method according to claim 7, wherein the classifying is selected from the group consisting of screening, air classifying, and elutriation.

9. A spherical boron nitride powder comprising spherical agglomerates of boron nitride platelets.

10. The spherical boron nitride powder according to claim 9, wherein the spherical boron nitride powder has a tap density of about 0.4 g/cc to about 0.7 g/cc.

11. The spherical boron nitride powder according to claim 9, wherein the spherical agglomerates of boron nitride platelets have an average agglomerate diameter of from about 10 microns to about 500 microns.

12. The spherical boron nitride powder according to claim 11, wherein the majority of boron nitride agglomerates have an average diameter of from about 30 microns to about 150 microns.

13. A method for making a hexagonal boron nitride paste comprising:
   providing a hexagonal boron nitride slurry and
   treating the slurry under conditions effective to produce a hexagonal boron nitride paste comprising from about 60 wt. % to about 80 wt. % solid hexagonal boron nitride.

14. The method according to claim 13, wherein the hexagonal boron nitride slurry comprises from about 30 wt. % to about 50 wt. % hexagonal boron nitride solids loading.

15. The method according to claim 13, wherein said treating comprises placing the slurry in a plaster mold.

16. The method according to claim 13, wherein said treating comprises vacuum filtration.

17. A hexagonal boron nitride paste comprising from about 60 wt. % to about 80 wt. % solid hexagonal boron nitride in a medium.

18. The hexagonal boron nitride paste according to claim 17, wherein the medium is an aqueous medium.

19. The hexagonal boron nitride paste according to claim 18, wherein the medium is a non-aqueous medium selected from the group consisting of isopropyl alcohol, methanol, and ethanol.

20. A polymer blend comprising:
   a polymer, and
   a powder phase comprising spherical agglomerates of hexagonal boron nitride platelets, wherein the powder phase is distributed homogeneously within the polymer.

21. The polymer blend according to claim 20, wherein the powder phase has a tap density of about 0.4 g/cc to about 0.7 g/cc.

22. The polymer blend according to claim 20, wherein the polymer is selected from the group consisting of melt-processable polymers, polyesters, phenolics, silicone polymers, acrylics, waxes, thermoplastic polymers, low molecular weight fluids, and epoxy molding compounds.

23. The polymer blend according to claim 20, wherein the polymer blend comprises from about 30 wt. % to about 80 wt. % spherical boron nitride powder.

24. The polymer blend according to claim 20, wherein the polymer blend has a thermal conductivity of from about 1 W/mK to about 15 W/mK.

25. The polymer blend according to claim 20, wherein the spherical agglomerates of hexagonal boron nitride platelets have an average agglomerate diameter of from about 10 microns to about 500 microns.

26. The polymer blend according to claim 25, wherein the majority of spherical agglomerates have an average diameter of from about 30 microns to about 150 microns.

27. A system comprising:
   a heat source;
   a heat sink; and
   a thermally conductive material connecting the heat source to the heat sink, wherein the thermally conductive material comprises a powder phase comprising spherical agglomerates of hexagonal boron nitride platelets.

28. The system according to claim 27, wherein the powder phase has a tap density of about 0.4 g/cc to about 0.7 g/cc.

29. The system according to claim 27, wherein the heat source is an integrated circuit chip, power module or transformer.

30. The system according to claim 27, wherein the heat sink is finned aluminum, copper, berilium or diamond.

31. The system according to claim 27, wherein the thermally conductive material comprises from about 30 wt. % to about 80 wt. % spherical boron nitride powder.

32. The system according to claim 27, wherein the thermally conductive material has a thermal conductivity of from about 1 W/mK to about 15 W/mK.

33. The system according to claim 27, wherein the spherical agglomerates of hexagonal boron nitride platelets have an average agglomerate diameter of from about 10 microns to about 500 microns.

34. The system according to claim 33, wherein the majority of spherical agglomerates have an average diameter of from about 30 microns to about 150 microns.

35. The system according to claim 27, wherein the thermally conductive material is a polymer.

36. The system according to claim 35, wherein the polymer is selected from the group consisting of melt-processable polymers, polyesters, phenolics, silicone polymers, acrylics, waxes, thermoplastic polymers, low molecular weight fluids, and epoxy molding compounds.

* * * * *